United States Patent
Horita

(10) Patent No.: US 6,445,237 B2
(45) Date of Patent: Sep. 3, 2002

(54) FLIP-FLOP CIRCUIT

(75) Inventor: Satomi Horita, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/771,642

(22) Filed: Jan. 30, 2001

(30) Foreign Application Priority Data

Feb. 4, 2000 (JP) .................................... 2000-027539

(51) Int. Cl.⁷ .......................................... H03K 3/037
(52) U.S. Cl. .................................... 327/215; 327/202
(58) Field of Search ............................. 327/199–203, 327/206, 208–219, 223

(56) References Cited

U.S. PATENT DOCUMENTS

| | | | | |
|---|---|---|---|---|
| 5,821,791 A | * | 10/1998 | Gaibotti et al. | 327/202 |
| 5,854,565 A | * | 12/1998 | Jha et al. | 327/202 |
| 5,939,915 A | * | 8/1999 | Curran | 327/202 |
| 5,945,858 A | * | 8/1999 | Sato | 327/115 |
| 6,097,230 A | * | 8/2000 | Bareither | 327/202 |
| 6,198,323 B1 | * | 3/2001 | Offord | 327/199 |

FOREIGN PATENT DOCUMENTS

| | | |
|---|---|---|
| JP | 56-86527 | 7/1981 |
| JP | 1-248820 | 10/1989 |
| JP | 4-16016 | 1/1992 |

* cited by examiner

*Primary Examiner*—My-Trang Nu Ton
(74) *Attorney, Agent, or Firm*—McGinn & Gibb, PLLC

(57) ABSTRACT

Flip-flop circuits FF1 to FF6 are each constructed as a pair of cascade connected latch circuits 21 and 22 in an arbitrarily combination. The latch circuits L1 and L2 each comprises an input stage push-pull circuit PP and an output stage hold circuit HD as CVSL circuit. The latch circuit L1 includes an input stage having two pairs of nMOSTs 2 to 5 receiving input data DP and DN inputted thereto and connected in series each and in parallel connection of the pairs and a pair of nMOSTs 1 to 6 receiving a clock CP inputted thereto and connected to the opposite sides of the parallel connection. The output stage hold circuit HD includes a CVSI circuit having two pairs of nMOSTs 7 and 10 and a pair of pMOSTs 12 and 13 and an nMOST 11 receiving a clock CN inputted thereto. Thus obtained flip-flop (FF) circuit permits construction of a high density semiconductor integrated circuit (IC) with fast operation and low power consumption.

20 Claims, 5 Drawing Sheets

PRIOR ART

FLIP-FLOP CIRCUIT

BACKGROUND OF THE INVENTION

This application claims benefit of Japanese Patent Application No. 2000-027539 filed on Feb. 4, 2000, the contents of which are incorporated by the reference.

The present invention relates to flip-flop circuits and, more particularly, to flip-flop circuits which can be constructed as high density and low power consumption semiconductor integrated circuits (ICs).

The flip-flop circuit (hereinafter abbreviated as FF circuit for the brevity sake) is one of the basic constituent elements of digital circuits, and various types of FF circuits have been proposed and used for various purposes.

Electronic devices and electronic application devices are in a trend of operation speed increase and performance improvement. Conventional high speed logic circuits usually use bipolar transistor logic circuits such as ECLs (Emitter-Coupled Logics). However, recent size and weight reduction of electronic devices and spread of battery-driven portable electronic devices, have led to increasing demand for logic circuits using MOS (Metal Oxide Semiconductor) transistors (hereinafter abbreviated as MOSTs) capable of integration density increase and power consumption reduction.

Prior art examples of such flip-flop meeting the above demand are disclosed in Japanese Patent Laid-Open No. 56--86527, Japanese Patent Laid-Open No. 1-248820 and Japanese Patent Laid-Open No. 4-16016. Furthermore, a DSL (Differential Split Level) circuit as shown in FIGS. 5A and 5B has been proposed.

FIG. 5A is a circuit showing a latch circuit L3 in an FF circuit. This latch circuit comprises an input circuit having three n-type MOS transistors (nMOSTs) 41 to 43, a CVSL (Cascade Voltage Switch Logic) circuit having a pair of nMOSTs 46 and 47 and a pair of p-type MOST transistors (pMOSTs) 48 and 49, the two transistor pairs being connected such that their inputs and outputs are in a crossing relation to one another, and nMOSTs 44 and 45 connected between the outputs of the input and CVSL circuits. The gate voltage on the nMOSTs 46 and 47 are set to Vdd/2+Vtn. Voltages on the drains of the nMOSTs 42 and 43, i.e., nodes D3P and D3N, can be raised only up to Vdd/2 even when they are at "H" (high) level. This potential is inputted to the gates of the pMOSTS 48 and 49, so that the pMOST 48 and 49 are not perfectly turned off. Thus, the outputs of these pMOSTs undergo fast changes, and operate substantially simultaneously. The other nMOSTs are effectively turned on because their gates are close to the ground level. The output of the latch circuit is thus determined by the difference between the currents in the two pMOSTs 48 and 49.

FIG. 5B is a block diagram showing an FF circuit, which is constructed by using two latch circuits L3 as shown in FIG. 5A. As shown, in this circuit the two latch circuits L3 are connected in cascade, and clock signals CP and CN are inputted to clock terminals of the first and second stage (i.e., master and slave) latch circuits L3, respectively. Input data signals DP and DN are fed to the master latch circuit, and output data QP and QN are obtained from the slave latch circuit.

However, in the above prior art circuit the potentials at the nodes D3P and D3N are determined by the nMOSTs when they are at "L" (low) level and by the pMOSTs when they are at "H" (high) level. This poses a problem that the operation speed is adversely affected by fluctuations of the nMOSTs and pMOSTs. In addition, the pMOSTs are slow in operation speed compared to the nMOSTs. Therefore, as for the potential changes at the nodes D3P and D3N the rising is delayed after the falling, thus posing a problem in the high speed operation. Furthermore, the amplitudes of the output signals QP and QN are substantially (GND–Vdd), which is disadvantageously too large for the high speed operation.

SUMMARY OF THE INVENTION

An object of the present invantion is therefore to provide a flip-flop (FF) circuit of a high density semiconductor integrated circuit (IC) with fast operation and low power consumption.

According to an aspect of the present invention, there is provided a flip-flop circuit comprising a pair of latch circuits each including a push-pull circuit input stage and a hold circuit output stage, the pair latch circuits being cascade connected as a master latch and a slave latch so as to be operable under control of a clock signal from a clock line.

The input stage of each latch circuit has two pairs of nMOS transistors or nMOSTs with push-pull data inputted thereto and connected in series/parallel connection, the series/parallel connection being connected via an nMOST with a clock signal inputted thereto between positive supply voltage side and ground. The input stage of each latch circuit has two pairs of nMOSTs, these pairs each receiving push-pull data inputted thereto, the nMOSTs in each of the pairs being connected in series between the positive supply voltage side and the ground, and a pair of clock controlled series nMOSTs each connected between the juncture of the nMOSTs in each pair and the output stage.

According to another aspect of the present invention, there is provided a flip-flop circuit comprising a latch circuit each having the above input stage, the latch circuit being cascade connected in an arbitrarily combination. The hold circuit in the latch circuit includes a CVSL circuit having two pairs of nMOSTs and a pair of pMOSTs and an nMOST connected between the CVSL circuit and ground, which is controlled by a clock signal.

The flip-flop circuit further comprises an input circuit having two pairs of nMOSTs and connected to the data input side of the master latch circuit, an output circuit having two pairs of nMOSTs and connected to the data output side of the slave latch circuit, and an input circuit having two pairs of nMOSTs and connected to the clock line of the two latch circuits.

The flip-flop circuit further comprises a buffer circuit inserted in the clock line to equalize the delay times in the master latch circuit and the clock line.

In the flip-flop, a plurality of cascade connections each of the master and slave latch circuits are connected in parallel and controlled by a common clock line.

Other objects and features will be clarified from the following description with reference to attached drawings.

PREFERRED EMBODIMENTS OF THE INVENTION

Preferred embodiments of the present invention will now be described with reference to the drawings.

The present invention is a FF circuit using the DSL circuit as described above and has the following features. A first feature resides in data hold control on the basis of a clock signal to realize faster data changes. A second feature resides in usage of the input stage push-pull circuits for the latch circuits of the FF circuit to alleviate adverse effects of fluctuations in the process (i.e., process of manufacture) of the input stage nMOSTs and p-MOSTs and realize fast operation. A third feature resides in modification of the push-pull circuit construction in the master and slave latch circuits in the FF circuit to further reduce the set-up and hold times and output delay time Tpd. A fourth feature reiseds in addition of the input stage push-pull circuit it is possible to reduce amplitude fast operation when using the DSL circuit for multiple stages.

Figure 1A:
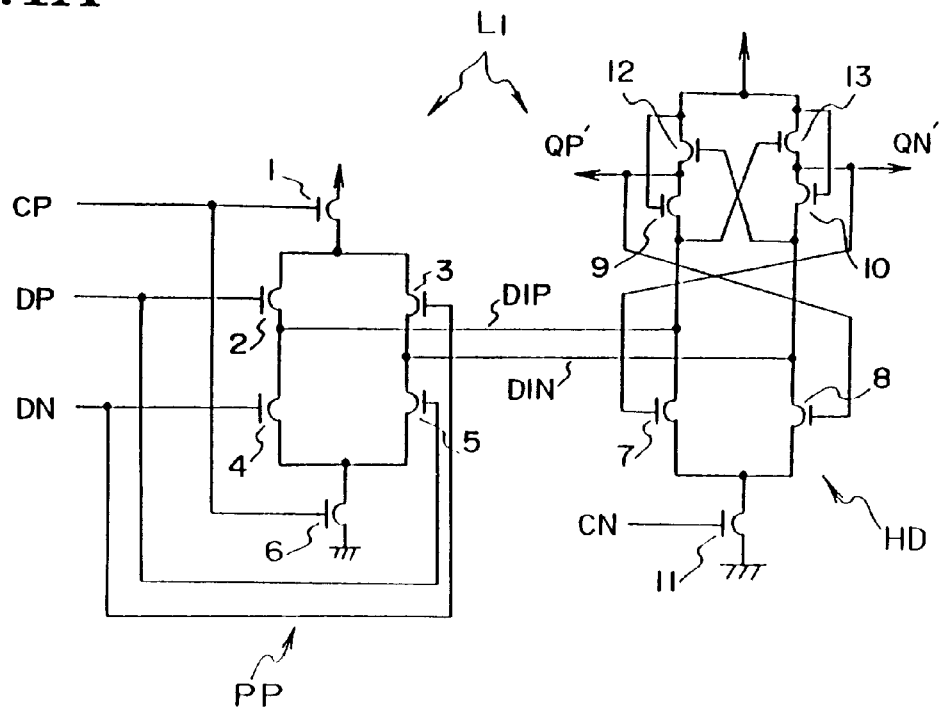
FIGS. 1A and 1B are circuit diagrams showing examples of latch circuit constituting the FF circuit according to the present invention.
Figure 1B:
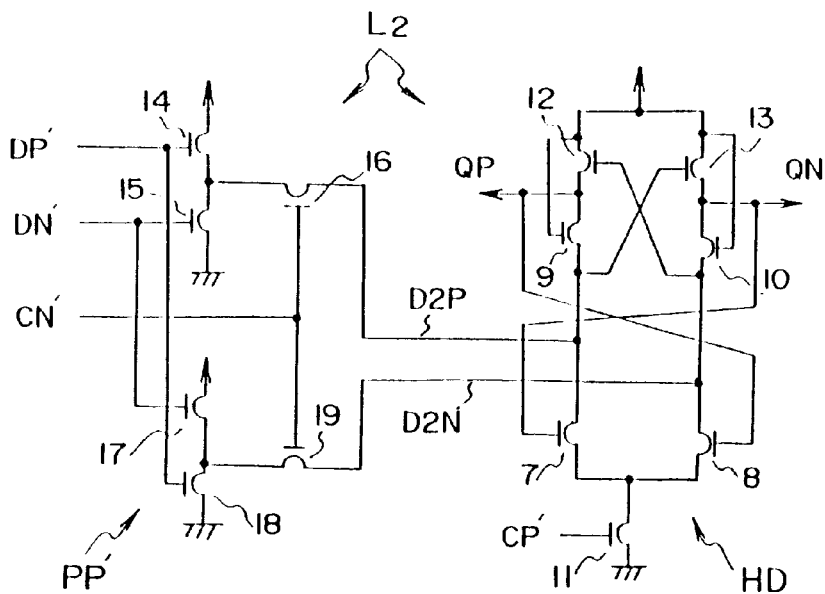
Figure 5A:
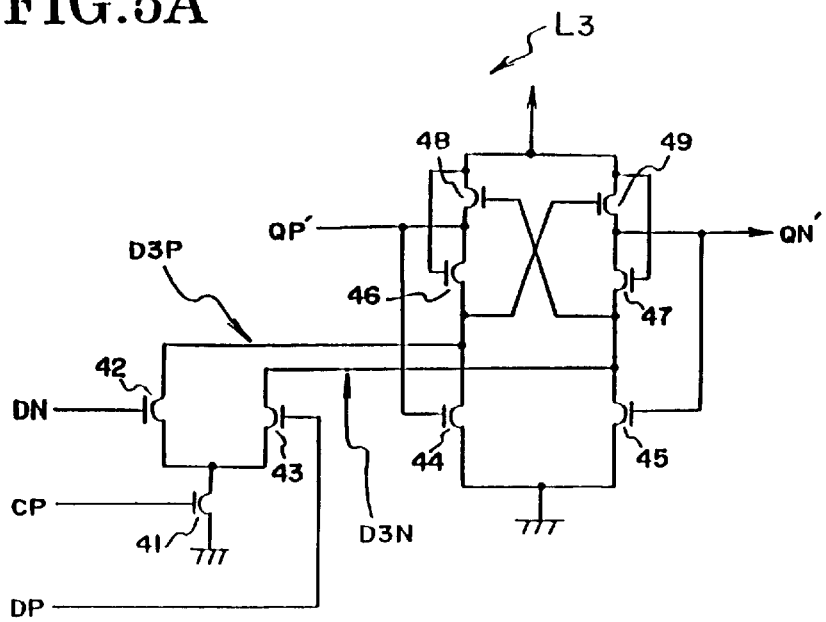
FIGS. 5A and 5B are a circuit showing a latch circuit in an FF circuit and a block diagram showing an FF circuit constructed by using two latch circuits shown in FIG. 5A.
Figure 5B:
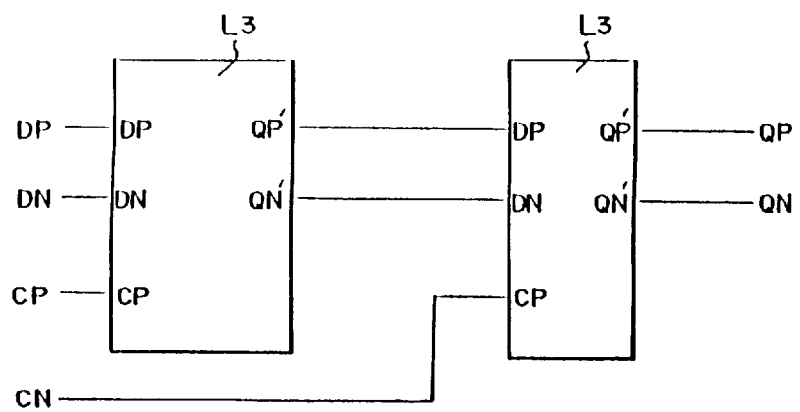

FIGS. 1A and 1B are circuit diagrams showing examples of latch circuit constituting the FF circuit according to the present invention. FIG. 1A shows a latch circuit L1, which comprises an input stage constituted by a push-pull circuit PP having six nMOSTs 1 to 6 and an output stage constituted by a hold circuit HD having five nMOSTs 7 to 11 and two pMOSTs 12 and 13. In the push-pull circuit PP, the nMOSTs 2, 4 and 3, 5, which data DP and DN are inputted to, are connected in series, respectively and the serially connected nMOSTs are connected in parallel. The nMOSTs 1 and 6 are connected to the positive voltage supply side (Vdd) and GND (ground), respectively. In the hold circuit HD, the pMOST 12 and the nMOSTs 9 and 7 are connected in series, and the pMOST 13 and the nMOSTs 10, 8 are connected in series. These two series connections are connected in parallel between positive supply voltage side and the drain of the nMOST 11, which receives clock CN inputted thereto. The source of the nMOS 11 is grounded. The gate of the nMOST 7 is connected together with the juncture between the pMOST 13 and the nMOPST 10 to an output terminal QN'. The gate of the nMOST 8 is connected together with the juncture between the pMOST 12 and the nMOST 9 to an output terminal QP'. The gate of the pMOST 12 is connected to the juncture between the nMOSTs 8 and 10, i.e., node DIN. The gate of the pMOST 13 is connected to the juncture between the nMOSTs 7 and 9, i.e., node DIP.

Where the nMOSTs 1 to 11 and the pMOSTs 12 and 13 in the latch circuit L1 all have the same gate length, the transistor size (i.e., gate width) of the pMOSTs 12 and 13 in the hold circuit HD is desirably several times, particularly two to three times, the transistor size (i.e., gate width) of the nMOSTs 7 to 10 or the nMOSTs 1 to 6 in the push-pull circuit PP. The main difference of the latch circuit L1 from the prior art latch circuit L3 shown in FIG. 5A resides in that the push-pull circuit PP is adopted as the input stage and that the clock control nMOST 11 is added to the feedback circuit part.

FIG. 1B is a circuit diagram showing the second example of latch circuit L2 which can be used for the FF circuit according to the present invention. This latch circuit L2 is different from the latch circuit L1 shown in FIG. 1A described above in a push-pull circuit PP' as the input stage. The hold circuit HD as the output stage has the same construction as the hold circuit shown in FIG. 1A, and like reference numerals are used. The push-pull circuit PP' as the input stage of the latch circuit L2 has six nMOSTs 14 to 19. The pairs of nMOSTs 14 and 15, and 17 and 18, which data DP' and DN' are inputted to, are serially connected between the positive supply voltage side and the GND (ground), and the nMOSTs 16 and 19 with clock CN' inputted thereto are serially connected between the junctures of nMOSTs in the pairs, i.e., nodes D2P and D2N.

The latch circuit L2 is constructed such that the propagation delay time (Tpd) from the clock change instant till the data output is reduced. The transistor size (i.e., gatewidth) is the same as in the latch circuit L1. That is, the transistor size of the nMOSTs 14 to 19 in the push-pull circuit PP' is desirably several times, particularly two to three times, the transistor size of the nMOSTs 7 to 11 in the hold circuit HD and is desiralably almost the same as those in the pMOSTs 12 and 13.

Figure 2A:
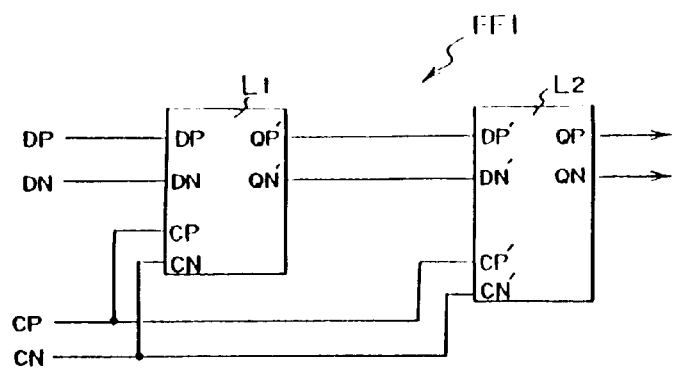
FIGS. 2A to 2D are block diagrams showing examples of FF circuit according to the present invention.
Figure 2B:
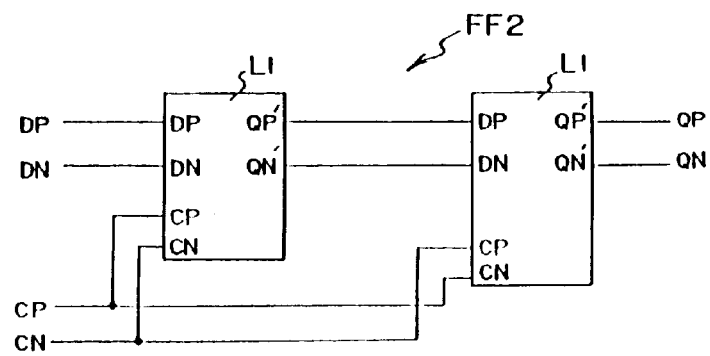
Figure 2C:
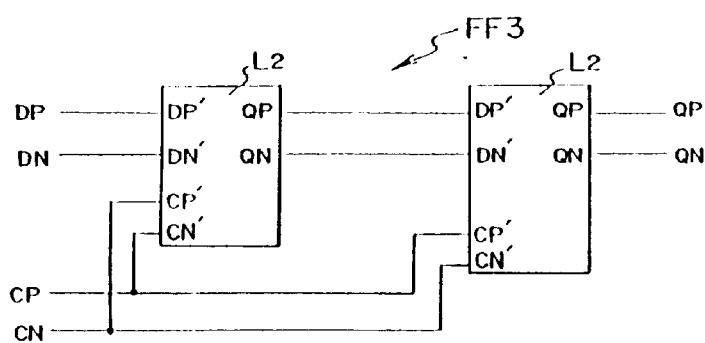
Figure 2D:
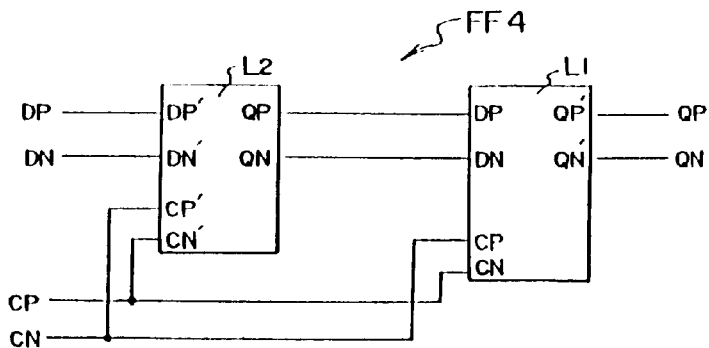

FIGS. 2A to 2D are block diagrams showing examples of FF circuit according to the present invention, which are constructed by connecting the latch circuits L1 and/or L2 shown in FIGS. 1A and/or 1B in cascade. FIG. 2A shows an FF circuit FF1, which is constructed by cascade connecting latch circuits L1 and L2 shown in FIGS. 1A and 1B as master and slave latch circuits, respectively. FIG. 2B shows an FF circuit FF2, which is constructed by cascade connecting two latch circuits L1 shown in FIG. 1A as master and slave circuits, respectively. FIG. 2C shows an FF circuit FF3, which is constructed by cascade connecting two latch circuits L2 shown in FIG. 1B as master and slave circuits, respectively. FIG. 2D shows an FF circuit FF4, which is constructed by cascade connecting latch circuits L2 and L1 shown in FIG. 1B and 1A as master and slave circuits, respectively.

Figure 3A:
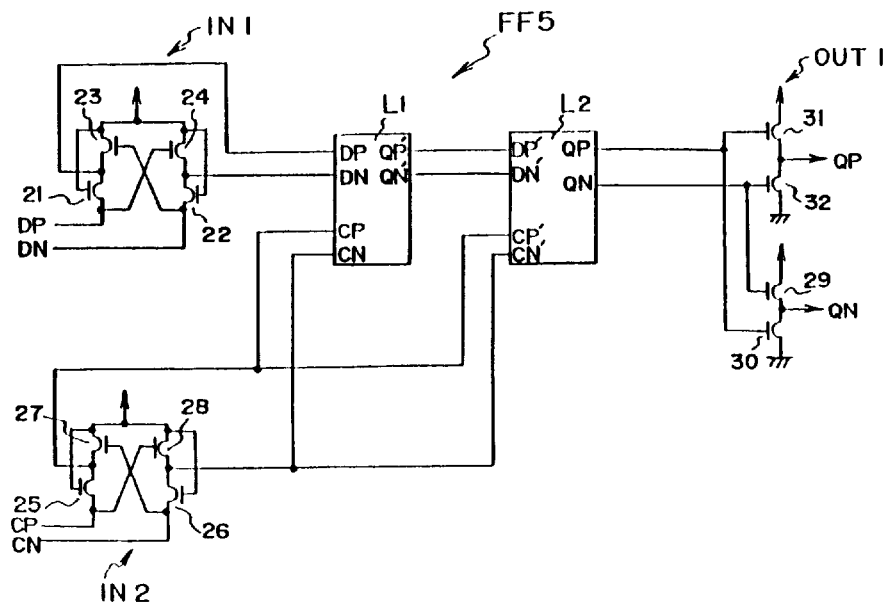
FIGS. 3A and 3B are block diagrams showing other embodiments of FF circuit according to the present invention.
Figure 3B:
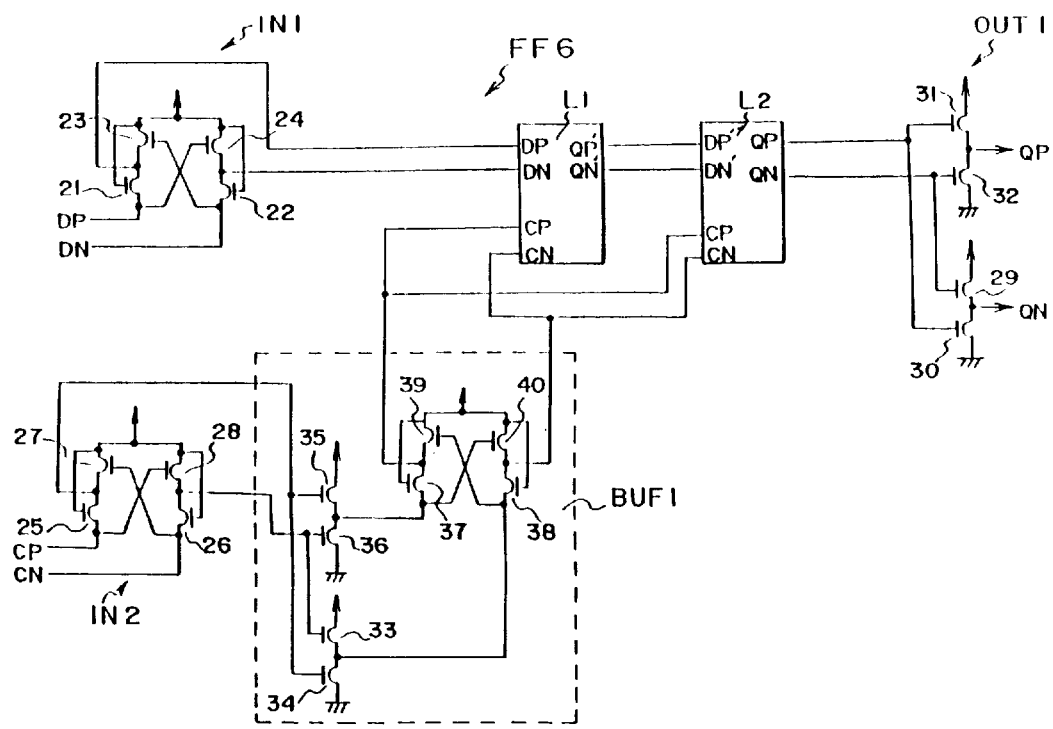

FIGS. 3A and 3B are block diagrams showing other embodiments of FF circuit according to the present invention. The FF circuits FF5 and FF6 shown in FIGS. 3A and 3B are the same as the FF circuit FF1 shown in FIG. 2A insofar as the latch circuits L1 and L2 shown in FIGS. 1A and 1B are cascade connected as master and the slave latch circuits, respectively, but are different in that additional circuits are connected to data input and output sides and also to clock line. Specifically, an input circuit IN1 (IN2) having a pair of nMOSTs 21 and 22 (25 and 26) and a pair of pMOSTs 23 and 24 (27 and 28), these pairs being in cross connection to each other, is connected to the input side of the master latch circuit L1 and to the clock line. An output circuit OUT1 having two pairs of nMOSTs 29 and 30, and 31 and 32, further connected to the output side of the slave latch circuit L2. These additional circuits IN1, IN2 and OUT1 have an effect of reducing the amplitude of the input, output and clock signals for faster operation.

In the FF circuit FF6 shown in FIG. 3B, in addition to connecting the input circuits IN1 and IN2 and the output circuit OUT1 like the FF circuit FF5 as shown in FIG. 3A, a buffer circuit BUF1 having six nMOSTs 33 to 38 and two pMOSTs 39 and 40, is connected as a further additional circuit subsequent to the input circuit IN2. By additionally connecting the buffer circuit BUF1 to the clock line, the delay times in the master latch L1 and the clock line can be made equal to reduce the data set-up and hold times and permit faster operation.

Figure 4:
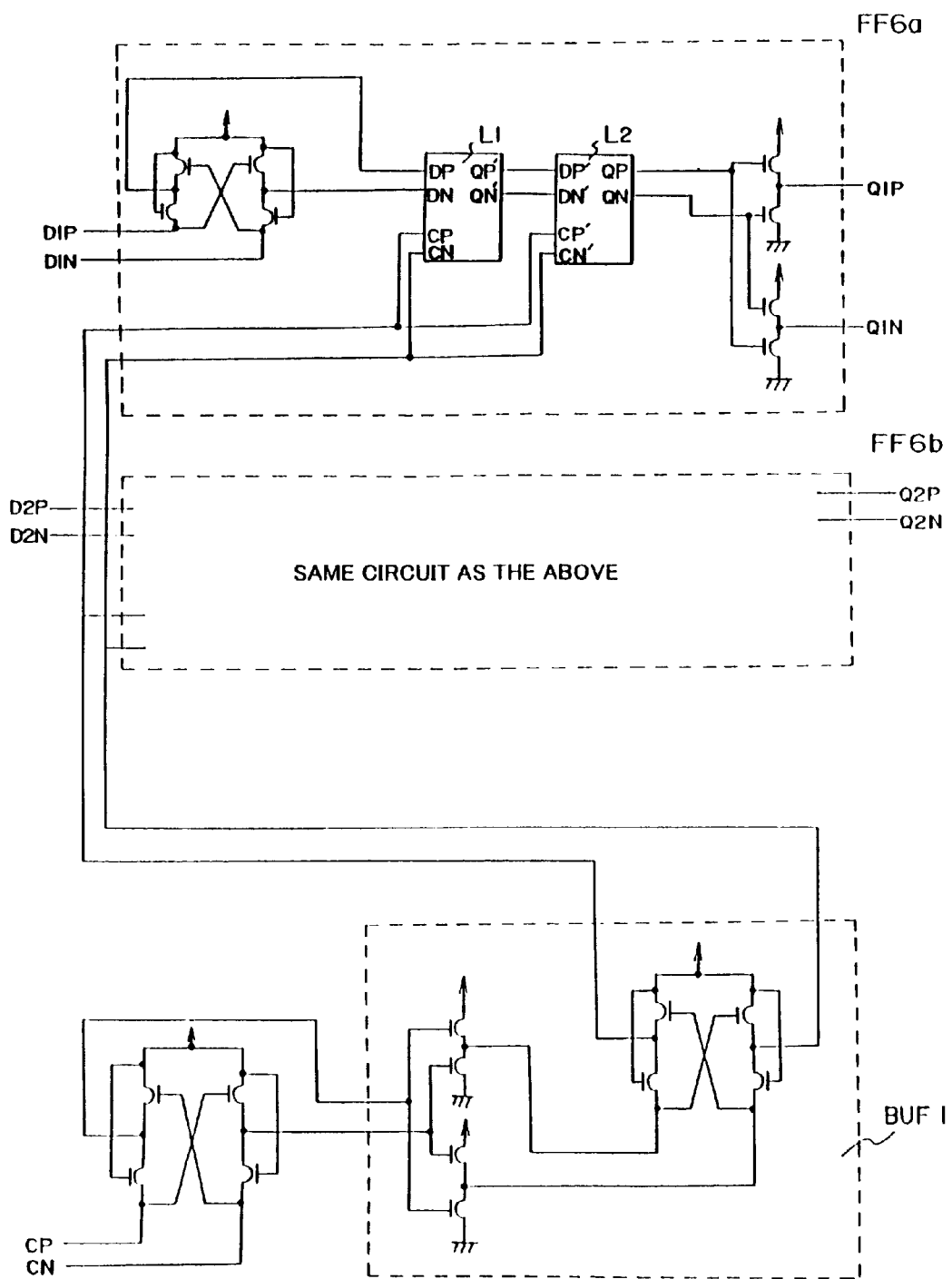
FIG. 4 is a schematic showing a further embodiment of FF circuit according to the present invention.

FIG. 4 is a schematic showing a further embodiment of FF circuit according to the present invention. This FF circuit is a plural bit FF circuit using a plurality of FF circuits FF6a, FF6b, . . . as shown in FIG. 3B. In this case, the clock line as shown in FIG. 3B is used as common clock line for a plurality of bits.

The principles underlying the operation of the FF circuit FF1 shown in FIG. 2A will now be described. Upon inversion of the input clock signal CP from "L" to "H" level, the nMOSTs 1 and 6 are turned on. As a result, the push-pull circuit PP becomes active, and the potentials at the nodes DIP and DIN on the side of the master latch L1 are complementarily inverted to the "H" or "L" level according to the input data DP and DN. At this time, the "H" level of the potentials at the nodes DIP and DIN fails to be equal to Vdd. Also, the pMOSTs 12 and 13 are not perfectly turned off because they receive the above potentials inputted to their gates. The outputs of the two p-MOSTs undergo quick changes and operate substantially simultaneously. The nMOSTs, on the other hand, are perfectly "on" because their gates are closer to the GND level. The outputs QP' and QN' of the master latch L1 are determined by the difference between the "on" currents in the two pMOSTs 12 and 13. At this time, the pMOST 11 is turned off to make the hold circuit HD ineffective, thus permitting faster data take-out.

Upon subsequent inversion of the clock signal from "H" to "L" level (i.e., inversion of the clock signal CN from "L" to "H" level), the nMOST 11 is turned on, i.e., the hold circuit 11 in the master latch circuit L1 becomes active. As a result, the potentials at the nodes D1P and N1P are controlled via the nMOSTs 7 and 8 and held at the controlled levels. At the same, time the nMOSTs 16 and 19 in the push-pull circuit PP in the slave latch L2 become active, and the potentials at the nodes D2P and D2N in the slave latch circuit L2 are complementarily inverted to "H" or "L" level according to the output data QP' and QN' of the master latch circuit L1. At this time, the "H" level potentials at the nodes D2P) and D2N fail to be equal to Vdd. In addition, the pMOSTs are not perfectly turned off because they receive the above potentials at their gates. Thus, the outputs of the pMOSTs undergo quick changes and operate substantially simultaneously. The nMOSTs are perfectly "on" because their gates are closer to the GND level. The outputs of the master latch L1 are determined by the difference between the "on" currents in the two pMOSTs 12 and 13.

In the embodiment of FF circuit FF5 shown in FIG. 3A, the input signals DP, DN, CP and CN and the output signals QP and QN are small amplitude signals, the amplitude of which is not (GND–Vdd) and failing to reach Vdd at the "H" level, and are thus suited to fast operation.

As has been described in the foregoing, with the FF circuit according to the present invention it is possible to obtain the following various pronounced practical effects. In the first place, by adding the input stage DSL circuit and the output stage push-pull circuit it is possible to reduce amplitude and realize fast operation when using the DSL circuit for multiple stages.

Secondly, by modifying the push-pull circuit construction in the master and slave latch circuits in the FF circuit, it is possible to further reduce the set-up and hold times and output delay time Tpd, which is suited for fast operation.

Thirdly, by using the input stage push-pull circuits for the latch circuits of the FF circuit, it is possible to alleviate adverse effects of process fluctuations in the input stage nMOSTs and pMOSTs as well as precluding the slow rising due to the pMOSTs and realizing fast operation.

Fourthly, by providing control according to clock signal for the data holding circuit, it is possible to realize faster data changes.

Changes in construction will occur to those skilled in the art and various apparently different modifications and embodiments may be made without departing from the scope of the present invention. The matter set forth in the foregoing description and accompanying drawings is offered by way of illustration only. It is therefore intended that the foregoing description be regarded as illustrative rather than limiting.

What is claimed is:

1. A flip-flop circuit comprising:
   a pair of latch circuits each including a push-pull circuit input stage and a hold circuit output stage, the pair of latch circuits being cascade-connected as a master latch and a slave latch so as to be operable under control of a clock signal from a clock line,
   wherein each said push-pull circuit input stage comprises four transistors interconnected so as to form a parallel combination of two transistors serially interconnected.

2. The flip-flop circuit according to claim 1, wherein the hold circuit in the latch circuit includes a CVSL circuit having two pairs of nMOSTs and a pair of pMOSTs and an nMOST connected between the CVSL circuit and ground, which is controlled by the clock signal.

3. The flip-flop circuit according to claim 1, which further comprises an input circuit having two pairs of nMOSTs and connected to the data input side of the master latch circuit, an output circuit having two pairs of nMOSTs and connected to the data output side of the slave latch circuit, and an input circuit having two pairs of nMOSTs and connected to the clock line of the two latch circuits.

4. The flip-flop circuit according to claim 1, which further comprises a buffer circuit inserted in the clock line to equalize the delay times in the matter latch circuit and the clock line.

5. The flip-flop according to claim 1, wherein a plurality of cascade connections each of the master and slave latch circuits are connected in parallel and controlled by a common clock line.

6. A flip-flop circuit comprising:
   a pair of latch circuits, each said pair of latch circuits including a push-pull circuit input stage and a hold circuit output stage, the pair of latch circuits being cascade-connected as a master latch and a slave latch so as to be operable under control of a clock signal from a clock line,
   wherein the input stage of each latch circuit comprises two pairs of nMOS transistors or nMOSTs with push-pull data inputted thereto, each said two pairs comprising two serially-connected nMOS or nMOSTs, said two pairs connected in parallel, said parallel-connected two pairs being connected at a first parallel connection point to a first nMOST having a clock signal inputted thereto at a gate, said first nMOST additionally connected to a positive supply voltage, said parallel-connected two pairs being connected at a second parallel connection point to a second nMOST having the clock signal inputted thereto at a gate, said second nMOST additionally connected to a ground.

7. A flip-flop circuit according to claim 6, said latch circuits being arbitrarily connected to form said cascade combination.

8. The flip-flop circuit according to claim 6, wherein the hold circuit in the latch circuit includes a CVSL circuit having two pairs of nMOSTs and a pair of pMOSTs and an nMOST connected between the CVSL circuit and ground, which is controlled by the clock signal.

9. The flip-flop circuit according to claim 6, which further comprises an input circuit having two pairs nMOSTs and connected to the data input side of the master latch circuit, and output circuit having two pairs of nMOSTs and connected to the data output side of the slave latch circuit, and an input circuit having two pairs of nMOSTs and connected to the clock line of the two latch circuits.

10. The flip-flop circuit according to claim 6, which further comprises a buffer circuit inserted in the clock line to equalize the delay times in the master latch circuit and the clock line.

11. The flip-flop according to claim 6, wherein a plurality of cascade connections are provided in which each of the master and slave latch circuits are connected in parallel and controlled by a common clock line.

12. A flip-flop circuit comprising:
a pair of latch circuits including a push-pull circuit input stage and a hold circuit output stage, the pair of latch circuits being cascade-connected as a master latch and a slave latch so as to be operable under control of a clock signal from a clock line,
wherein the input stage of each latch comprises a first input of two serially-interconnected nMOSTs and a second input of two serially-interconnected nMOSTs, each of said first input and said second input receiving push-pull data inputted thereto, each of said first input and said second input being respectively connected in series between a positive supply voltage and a ground, each of said first input and said second input connecting respectively to said hold circuit output stage via an nMOST having a gate controlled by the clock line.

13. A flip-flop circuit according to claim 12, said latch circuits being arbitrarily connected to form said cascade combination.

14. The flip-flop circuit according to claim 12, wherein the hold circuit in the latch circuit includes a CVSL circuit having two pairs of nMOSTs and a pair of pMOSTs and an nMOST connected between the CVSL circuit and ground, which is controlled by the clock signal.

15. The flip-flop circuit according to claim 12, which further comprises an input circuit having two pairs of nMOSTs and connected to the data input side of the master latch circuit, an output circuit having two pairs of nMOSTs and connected to the data output side of the slave latch circuit, and an input circuit having two pairs of nMOSTs and connected to the clock line of the latch circuits.

16. The flip-flop circuit according to claim 12, which further comprises a buffer circuit inserted in the clock line to equalize the delay times in the master latch circuit and the clock line.

17. The flip-flop according to claim 12, wherein a plurality of cascade connections are provided in which each of the master and slave latch circuits are connected in parallel and controlled by a common clock line.

18. A flip-flop circuit comprising:
a first latch circuit serving as a master latch; and
a second latch circuit serving as a slave latch, said first latch and said second latch being connected in cascade,
each of said first latch circuit and said second latch circuit comprising a push-pull circuit input stage and a hold circuit output stage,
wherein each said push-pull circuit input stage comprises:
a first input comprising a first of two serially-interconnected transistors, said first input circuit receiving a first input data signal and a second input data signal, each into a respective one of said two transistors of said first of two serially-interconnected transistors; and
a second input circuit comprising a second of two serially-interconnected transistors, said second input circuit receiving said first input data signal and said second input data signal, each into a respective one of said two transistors of said second of two serially-interconnected transistors.

19. The flip-flop circuit of claim 18, wherein said first input circuit and said second input circuit are interconnected into a parallel circuit.

20. The flip-flop circuit of claim 18, wherein an output signal of each of said first input circuit and said second input circuit connect as an input to said hold circuit output stage via a transistor controlled by a clock signal.

* * * * *